(12) United States Patent
Larson et al.

(10) Patent No.: US 7,846,288 B2
(45) Date of Patent: Dec. 7, 2010

(54) METHODS AND SYSTEMS FOR REMOVING PROTECTIVE FILMS FROM MICROFEATURE WORKPIECES

(75) Inventors: Charles E. Larson, Nampa, ID (US); Randall S. Parker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1215 days.

(21) Appl. No.: 11/432,165

(22) Filed: May 10, 2006

(65) Prior Publication Data

US 2007/0261783 A1 Nov. 15, 2007

(51) Int. Cl.
*B32B 38/10* (2006.01)
(52) U.S. Cl. .................. 156/247; 156/344; 156/584; 438/976
(58) Field of Classification Search ............... 156/344, 156/584, 247; 438/464, 976
See application file for complete search history.

(56) References Cited

U.S. PATENT DOCUMENTS

| 4,631,103 | A | * | 12/1986 | Ametani | 156/241 |
| 4,867,836 | A | * | 9/1989 | Hamamura et al. | 156/584 |
| 5,344,521 | A | * | 9/1994 | Ohsaki | 156/584 |
| 5,358,591 | A | * | 10/1994 | Candore | 156/344 |
| 6,500,298 | B1 | * | 12/2002 | Wright et al. | 156/344 |
| 2004/0126923 | A1 | | 7/2004 | Benson | |

* cited by examiner

*Primary Examiner*—Mark A Osele
(74) *Attorney, Agent, or Firm*—Perkins Coie LLP

(57) ABSTRACT

Methods and systems for removing protective films from microfeature workpieces are disclosed herein. One particular embodiment of such a method comprises separating at least a portion of a protective tape from a workpiece to which the protective tape is attached with a separator configured to drive against an interface between the protective tape and the workpiece. The method further includes engaging the portion of the protective tape detached from the workpiece with a removal system.

49 Claims, 4 Drawing Sheets

METHODS AND SYSTEMS FOR REMOVING PROTECTIVE FILMS FROM MICROFEATURE WORKPIECES

TECHNICAL FIELD

The present invention is related to methods and systems for removing protective films from microfeature workpieces.

BACKGROUND

Microelectronic devices are used in cell phones, pagers, personal digital assistants, computers, and many other products. One process for packaging microelectronic devices is wafer-level packaging. In wafer-level packaging, a plurality of microelectronic dies are formed on a wafer and a redistribution layer is formed over the dies. The redistribution layer includes a dielectric layer and a plurality of conductive lines in the dielectric layer that define ball-pad arrays. Each line has one end connected to a bond-pad on a die and another end connected to a ball-pad of an array. Each ball-pad array is arranged over a corresponding microelectronic die. After forming the redistribution layer on the wafer, a stenciling machine deposits discrete blocks of solder paste onto the ball-pads of the redistribution layer or balls are attached using ball-attach machines. The solder paste is then reflowed to form solder balls or solder bumps on the ball-pads. After forming the solder balls on the ball-pads, the wafer is cut to singulate the dies, and the individual dies can then undergo further processing.

Wafer-level packaging is a promising development for reducing the cost of manufacturing microelectronic devices. By "prepackaging" the individual dies with the redistribution layer before cutting the wafers to singulate the dies, sophisticated semiconductor processing techniques can be used to form smaller arrays of solder balls. Additionally, wafer-level packaging is an efficient process that simultaneously packages a plurality of dies to reduce costs, increase throughput, and increase performance.

One concern of wafer-level packaged microelectronic devices, however, is that the bare dies may be chipped or damaged during processing (e.g., backgrinding, dicing, plating, etc.) and/or post-processing handling. To help alleviate this problem, a protective film or cover can be placed over the front side and/or the back side of each wafer before processing. Currently, this protective film is a sheet of tape that is applied to each individual wafer before processing, and then subsequently removed from the individual wafers after processing.

Conventional processes for removing the sheet of tape from the workpiece generally include applying a removal or "detape" tape to the protective tape to help lift the protective tape off the workpiece. FIG. 1, for example, is a schematic cross-sectional view of a conventional system 10 for removing protective tape from a microfeature workpiece 12. The workpiece 12 includes a first side 14 and a second side 16 opposite the first side 14. The first side 14 is releasably attached to a layer of mounting tape 22 on a support member 20, and the second side 16 is generally covered by a protective tape 18. The system 10 includes a plurality of rollers to position, apply, and subsequently lift off a removal tape 30 from the workpiece 12. More specifically, in a previous processing step an application roller (not shown) applied the removal tape 30 onto at least a portion of the protective tape 18. After application of the removal tape 30, a take-up roller assembly 32 or the workpiece 12 moves such that the take-up roller assembly 32 progresses relative to the protective tape 18 (as shown by the arrow A) to lift or pull up the removal tape and corresponding portions of the protective tape 18 from the workpiece.

One drawback with this approach, however, is that the removal tape 30 must be placed precisely on the workpiece 12 and over the protective tape 18. For example, a leading edge 31 of the removal tape 30 must generally be positioned within about 0.5 mm of the edge of the workpiece 12 to be effective. If the removal tape 30 overhangs or is too close to the edge of the workpiece 12, the removal tape 30 can inadvertently adhere to the mounting tape 22 and lifting or pulling up on the removal tape can crack or otherwise damage the edge of the workpiece. On the other hand, if the leading edge 31 of the removal tape 30 is positioned too far inboard of the edge of the workpiece 12, the removal tape may not initiate removal of the edge of the protective tape 18.

FIG. 2 is a schematic cross-sectional view of another conventional system 40 for removing the protective tape 18 from the workpiece 12. In this system, the removal tape 30 is applied to the workpiece 12 and over desired portions of the protective tape 18 using a peel bar 50. More specifically, the peel bar 50 is positioned at a desired location relative to the edge of the workpiece 12 (e.g., within about 0.5 mm of the edge) and pressure is applied to the peel bar such that the bar applies a portion of the removal tape 30 to a desired portion of the protective tape 18. The workpiece 12 then moves relative to the peel bar 50 (as shown by the arrow B) and the removal tape 30 begins to lift up and remove the corresponding portions of the protective tape 18 on the workpiece 12.

This approach, however, also includes a number of drawbacks. For example, in situations where the workpiece 12 is extremely thin, the peel bar 50 must be precisely positioned relative to the edge of the workpiece to avoid cracking or otherwise damaging the workpiece. Furthermore, as with the system 10 described above with reference to FIG. 1, the leading edge of the removal tape 30 must be precisely positioned relative to the edge of the workpiece 12 in order to effectively remove the protective tape 18. If the peel bar 50 is positioned too close to the edge, it may overhang the workpiece 12 and inadvertently contact the mounting tape (as shown in broken lines), potentially cracking or breaking the edge of the workpiece. On the other hand, if the peel bar 50 is positioned too far inboard of the edge of the workpiece 12, the removal tape 30 may not have enough force to initiate removal of the edge of the protective tape 18 on the workpiece.

Yet another drawback with the system 40 is that it can be difficult to control the amount of force applied by the peel bar 50 to the workpiece 12. For example, after the peel bar 50 is precisely positioned at a desired location relative to the workpiece's edge, the peel bar must press against the workpiece 12 with a force sufficient to apply the removal tape 30 to the protective tape 18 and initiate the removal process. If the peel bar 50 presses too hard against the workpiece 12, it may crack or damage the workpiece. On the other hand, if the peel bar 50 does not press hard enough against the workpiece 12, the removal tape 30 will not laminate to the protective tape 18 with sufficient force to initiate removal of the protective tape. Accordingly, there is a need to improve the methods and systems for removing protective films from microfeature workpieces.

DETAILED DESCRIPTION

A. Overview

Figure 1:
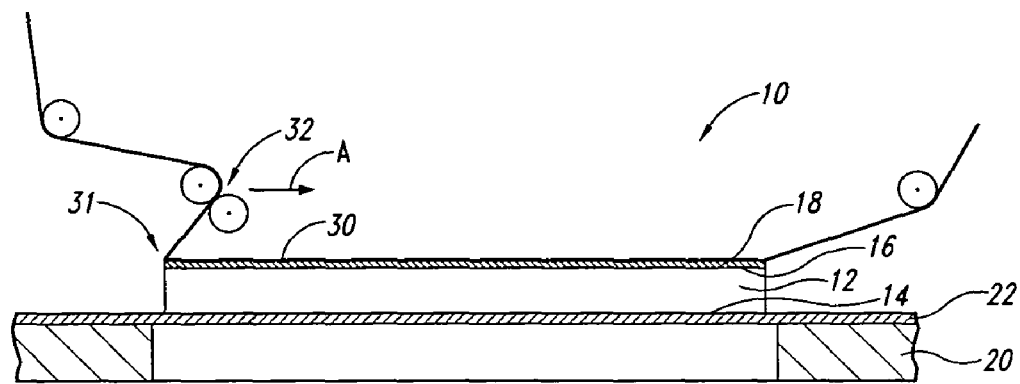
FIG. 1 is a schematic cross-sectional view of a system for removing protective tape from a microfeature workpiece in accordance with the prior art.

The present invention is directed toward methods and systems for removing protective films from microfeature workpieces. One aspect of the invention is directed toward methods for processing a microfeature workpiece. An embodiment of such a method comprises separating at least a portion of a protective tape from a workpiece to which the protective tape is attached with a separator configured to drive against an interface between the protective tape and the workpiece. The method further includes engaging the portion of the protective tape detached from the workpiece with a removal system. The separator can have several different configurations. In one embodiment, for example, the separator can include a gas delivery device positioned to impinge a stream of gas on the interface. In another embodiment, the separator can include a removal roller assembly including a plurality of flexible bristles configured to engage an edge portion of the protective tape at a periphery portion of the workpiece and move the protective tape away from the workpiece.

Another embodiment of a method comprises providing a microfeature workpiece having a first side, a second side opposite the first side, and a protective film releasably attached to the first side of the workpiece. The method includes detaching at least a portion of the protective film from the workpiece by impinging a stream of gas on the protective film. In several embodiments, the stream of gas includes a high-velocity gas stream precisely directed to an interface between the protective film and the first side of the workpiece with an air knife or another suitable gas delivery device.

Still another embodiment of a method for processing microfeature workpieces includes releasably attaching a protective film to a first side of a microfeature workpiece and releasably attaching a second side of the workpiece to a support member. The method also includes initiating detachment of the protective film from the workpiece by impinging a stream of gas from an air knife on an interface between the protective film and the first side of the workpiece. The method then includes engaging the detached portion of the protective film with a removal system and controllably removing the remaining portions of protective film from the workpiece using the air knife and/or the removal system.

Another aspect of the invention is directed to systems for processing microfeature workpieces. An embodiment of one such system includes processing a workpiece having a first side and a second side opposite the first. The first side of the workpiece is covered at least in part by a protective film and the second side of the workpiece is releasably attached to a support member. The system also includes a gas delivery device positioned to direct a stream of gas toward an interface between the protective film and the first side of the workpiece to detach at least a portion of the protective film from the workpiece. In several embodiments, the gas delivery device can include an air knife having a plurality of nozzles arranged in a desired pattern to expel the gas.

The term "microfeature workpiece" is used throughout to include substrates upon which and/or in which microelectronic devices, micromechanical devices, data storage elements or layers, vias or conductive lines, micro-optic features, micromechanical features, and/or microbiological features are or can be fabricated. For example, microfeature workpieces can be semiconductor wafers (e.g., silicon or gallium arsenide wafers), dielectric substrates (e.g., glass or ceramic), and many other types of materials. Microfeature workpieces typically have submicron features with dimensions of 0.05 µm or greater. The term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Many specific details of certain embodiments of the invention are set forth in the following description and in FIGS. 3A-7 to provide a thorough understanding of these embodiments. A person skilled in the art, however, will understand that the invention may be practiced without several of these details or additional details can be added to the invention.

Figure 3A:
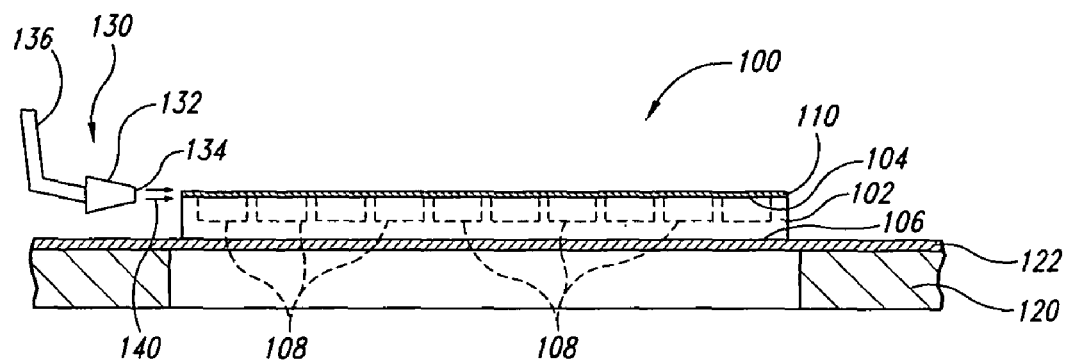
FIGS. 3A-3C are schematic cross-sectional views of various stages in a method for removing a protective film from a microfeature workpiece in accordance with an embodiment of the invention.
Figure 3B:
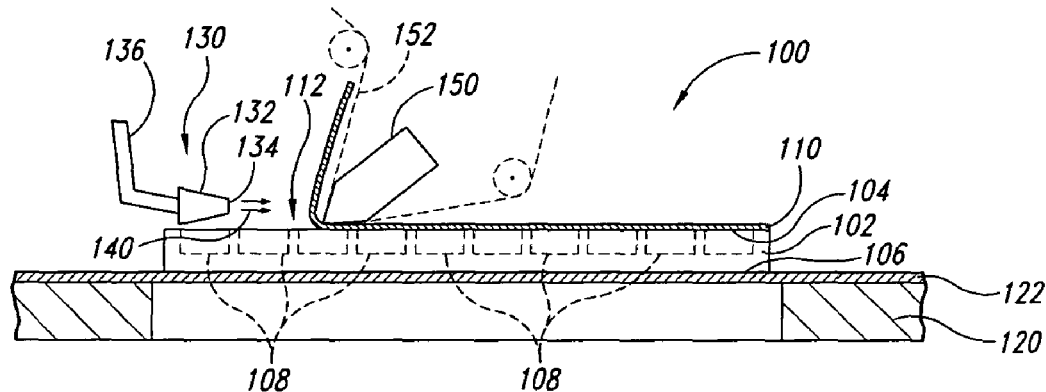
Figure 3C:
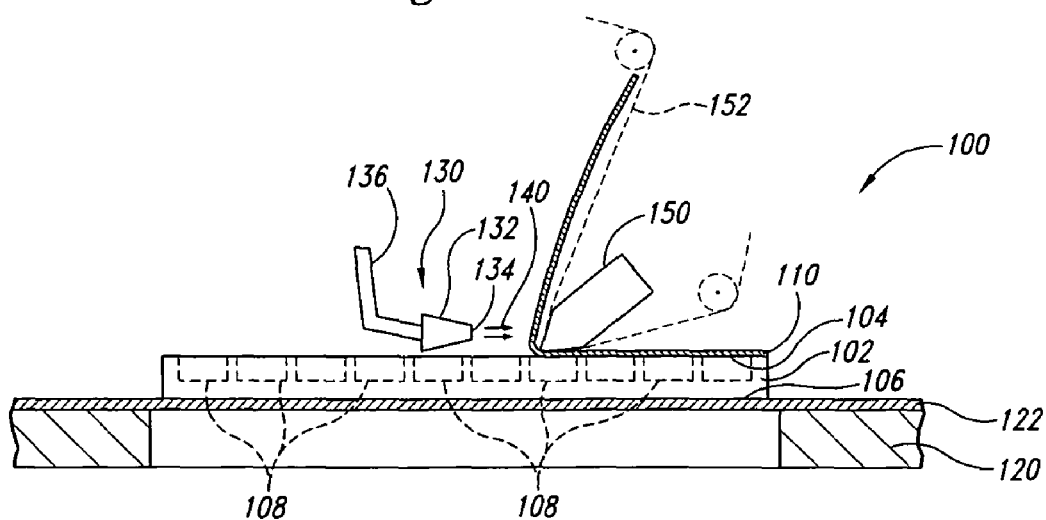

B. Systems and Methods for Removing Protective Films from Microfeature Workpieces FIGS. 3A-3C illustrate various stages in a method for removing a protective film from a microfeature workpiece in accordance with an embodiment of the invention. FIG. 3A, for example, is a schematic cross-sectional view of an assembly 100 including a microfeature workpiece 102 carried by a support member 120 at an initial stage of the method. The workpiece 102 includes a first side 104 and a second side 106 facing opposite the first side 104. The workpiece 102 can include a plurality of microelectronic components 108 (shown in broken lines) positioned in and/or on the workpiece 102. The components 108 can include microelectronic dies having circuit elements such as lines, vias, terminals, transistors, data storage elements, image sensors, or other conductor or semiconductor components arranged in an array on the workpiece 102. In other embodiments, the components 108 can include different features, have different arrangements, or include other suitable microfeature devices. In previous processing steps, a protective film or layer 110 (e.g., a facetape or other suitable adhesive film) was applied to all or a substantial portion of the first side 104 of the workpiece 102 to protect the individual components 108 during previous processing (e.g., backgrinding, plating, etc.) and/or handling of the workpiece.

The second side 106 of the workpiece 102 is releasably attached to an attachment device 122 (e.g., mounting tape) on the support member 120. The support member 120 can include a dicing frame, a vacuum table, a vacuum chuck or other vacuum-type support, or another suitable support member configured to support the workpiece 102 during processing. In the illustrated embodiment, the support member 120 is configured to hold the workpiece 102 generally stationary. In other embodiments, however, the support member 120 can be mounted to a conveyor or other device that moves the assembly 100 during the protective film removal process.

An air knife 130 is positioned to direct a stream of gas toward the assembly 100 to initiate detachment of the protective film 110 from the workpiece 102. The air knife 130 includes a head or tip 132 having at least one nozzle 134. In several embodiments, for example, the tip 132 includes a plurality of nozzles 134 arranged such that the resulting stream of gas 140 includes a relatively wide, flat profile to direct the high-velocity air stream along a significant portion of the workpiece's edge. In other embodiments, however, the nozzles 134 can have a different arrangement. The air knife 130 also includes a supply line 136 operably coupled between the head portion 132 and a gas supply (not shown) to deliver the gas to the head portion 132. The gas expelled by the air knife 130 can be clear dry air, nitrogen, or another suitable inert, generally particle-free gas. Importantly, the gas should not include any chemically reactive elements that could contaminate or otherwise damage the workpiece 102. In many embodiments, the gas can have a pressure of about 80-120 psi upstream from the tip 132, but the gas can have a different pressure in other embodiments. In still other embodiments, other suitable devices can be used in addition to, or in lieu of, the air knife 130 to direct the stream of gas 140 toward the assembly 100 to initiate detachment of the protective film 110.

Referring next to FIG. 3B, the high-velocity stream of gas 140 from the air knife 130 impinges an interface between an edge portion of the protective film 110 and a peripheral portion 112 of the workpiece 102 with sufficient force such that the film 110 begins to separate from the first side 104 of the workpiece. The air knife 130 accordingly acts as a separator to initiate detachment of the protective film 110 from the workpiece 102. In one aspect of this embodiment, a removal system 150 (shown schematically) can engage the detached or free end of the protective film 110 to control the movement of the free end of the protective film 110 as it separates from the workpiece 102. The removal system 150 can include, for example, a removal tape assembly 152 (shown in broken lines) that adheres to the free portion of the protective film 110 and lifts the protective film 110 away from the workpiece 102 as the gas stream 140 continues to impinge on the interface between the protective film 110 and the first side 104 of the workpiece. The removal tape assembly 152 can optionally include a peel bar (not shown) that engages the detached portion of the protective film 110 to apply the removal tape to the desired portions of the protective film 110. In other embodiments, the removal system 150 can include a vacuum-type securing device that engages the detached portion of the protective film 110 and pulls the film away from the workpiece 102. In still other embodiments, the removal system 150 can include other suitable devices for controllably engaging the detached portion of the protective film 110, or the removal system 150 may not be used.

Referring next to FIG. 3C, the removal system 150 continues to controllably lift or pull the protective film 110 from the workpiece 102 until the film is completely removed from the workpiece 102. In the illustrated embodiment, the air knife 130 continues to direct the stream of gas 140 toward the interface between the protective film 110 and the workpiece 102 to help further detach the film from the workpiece in conjunction with the removal system 150. In other embodiments, however, the air knife 130 can be deactivated once the protective film 110 is initially detached and the removal system 150 alone can complete the film removal process.

Figure 2:
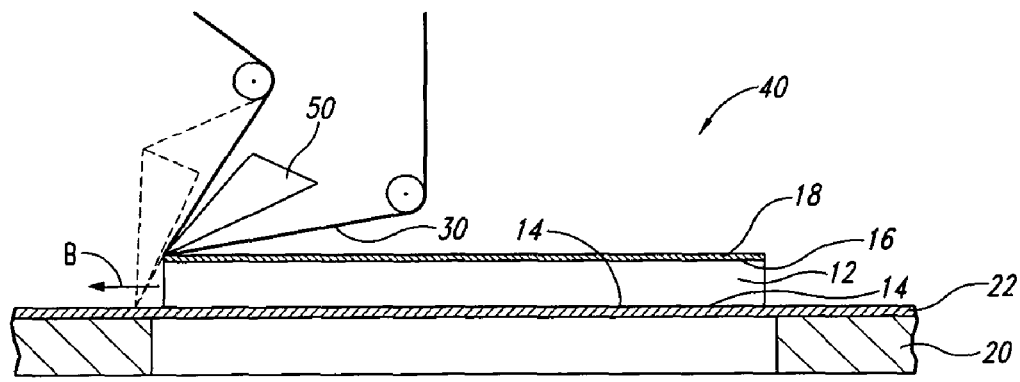
FIG. 2 is a schematic cross-sectional view of another system for removing protective tape from a microfeature workpiece in accordance with the prior art.

Several embodiments of the non-contact methods illustrated above in FIGS. 3A-3C for initiating detachment of the protective film 110 from the workpiece 102 are expected to reduce costs and increase throughput as compared with conventional systems for removing protective tape from workpieces. The conventional processes described above with respect to FIGS. 1 and 2, for example, require precisely positioning an edge of a removal tape and/or a peel bar within about 0.5 mm of the edge of the workpiece to begin the removal process. This positioning process can be extremely time-consuming and labor-intensive. The methods for initiating removal of the protective film 110 with the stream of gas 140 described above, however, eliminate the problems and time-consuming steps associated with precisely positioning the removal tape or peel bar at the edge of the workpiece. Accordingly, several embodiments of the methods set forth above with respect to FIGS. 3A-3C are expected to be faster, more efficient, and less expensive than conventional processes.

Another aspect of several embodiments of the methods described with reference to FIGS. 3A-3C is that the air knife 130 initiates detachment of the protective film 110 without physically contacting the protective film 110 or the workpiece 102. As discussed previously, conventional processes require that the removal tape and/or peel bar contact the protective tape within about 0.5 mm of the edge of the workpiece and, accordingly, the workpiece is highly susceptible to cracking or other damage during the removal process. On the other hand, the foregoing methods are particularly suitable for applications including extremely thin workpieces (e.g., workpieces having a thickness less than about 100-200 µm) and/or workpieces including sensitive components because the protective film is removed from at least the edge portions of the workpiece without contacting or otherwise physically engaging the workpiece.

C. Additional Embodiments of Systems and Methods for Removing Protective Films from Microfeature Workpieces FIGS. 4-7 illustrate various stages in methods for removing protective films from microfeature workpieces in accordance with additional embodiments of the invention. In each of FIGS. 4-7, several of the features may be the same as those discussed above in connection with FIGS. 3A-3C. Accordingly, like reference numbers are used to refer to like components in FIGS. 3A-7. The methods described below can also have many of the same advantages as those described above with respect to FIGS. 3A-3C, but the methods described below can have additional or different advantages.

Figure 4:
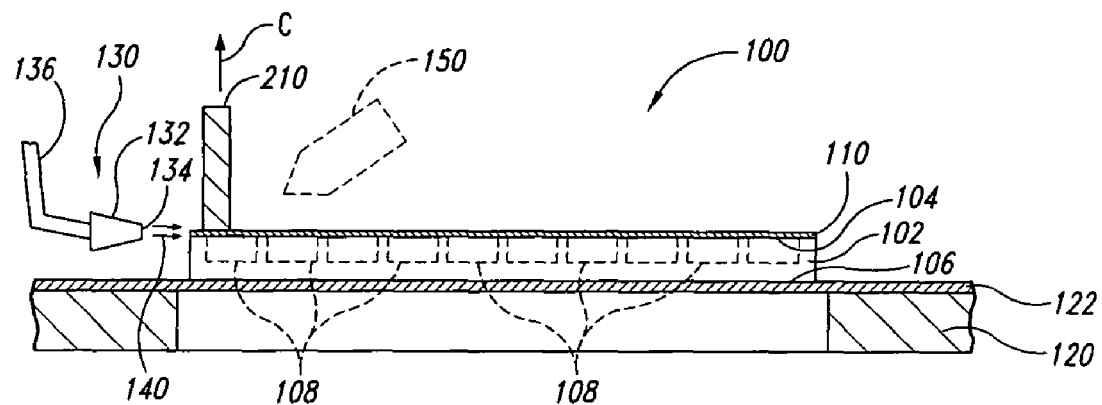
FIG. 4 is a schematic cross-sectional view of a stage in a method for removing a protective film from a microfeature workpiece in accordance with another embodiment of the invention.

FIG. 4, for example, is a schematic cross-sectional view of the assembly 100 at an initial stage of the method before initiating removal of the protective film 110 from the workpiece 102. This stage of this method differs from the stage described above with reference to FIG. 3A in that a vacuum-type removal system 210 is engaged with a portion of the protective film 110 proximate to the edge portion of the workpiece 102. The removal system 210 can have a compressible lip at its distal end to cushion the interface between the removal system 210 and the workpiece 102 at initial engagement. The removal system 210 can be used in conjunction with the air knife 130 to help initiate detachment of the protective film 110 from the workpiece 102 and control the free portion of the protective film 110. In the illustrated embodiment, for example, the removal system 210 begins to lift or pull the protective film 110 upward (as shown by the arrow C) at or about the same time as the air knife 130 directs the stream of gas 140 toward the interface between the protective film 110 and the workpiece 102. As such, the air knife 130 can separate the edge of the protective tape 110 from the workpiece 102, and the removal system 210 can peel the protective tape 110 from the workpiece 102 either with or without further use of the air knife 130. In other embodiments, the securing device 210 can begin to draw the protective film 110 upward either before or after the air knife 130 is activated. Optionally, the removal system 150 (shown in broken lines) can engage the detached or free end of the protective film 110 and help lift or otherwise move the film away from the workpiece 102 as described above.

Figure 5:
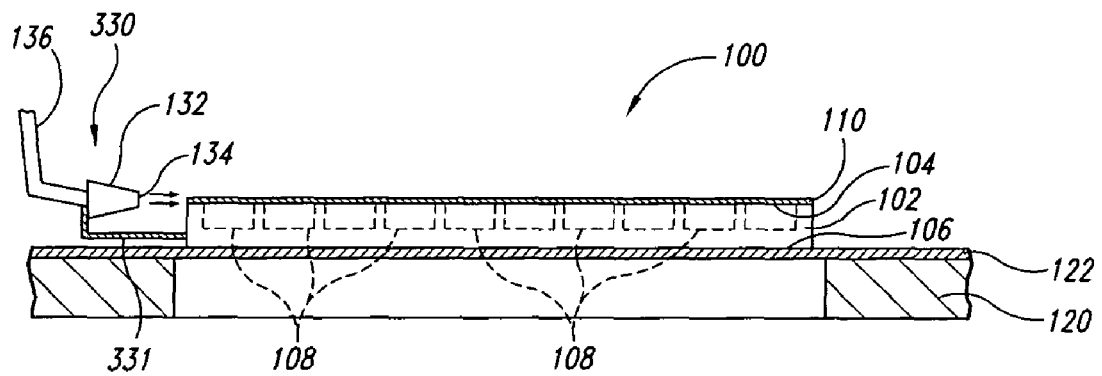
FIG. 5 is a schematic cross-sectional view of a stage in a method for removing a protective film from a microfeature workpiece in accordance with still another embodiment of the invention.

FIG. 5 illustrates an air knife 330 for removing the protective film 110 from the workpiece 102 in accordance with still another embodiment of the invention. The air knife 330 includes a shield 331 attached to the tip 132. The shield 331 is positioned to protect the attachment device 122 of the support member 120 from the stream of gas 140 expelled from the air knife 330. One advantage of the shield 331 is that it helps prevent the stream of gas 140 from inadvertently impinging on the interface between the workpiece 102 and the attachment device 122 and potentially shifting or otherwise moving the workpiece. Additionally, the shield 331 helps prevent the stream of gas 140 from potentially damaging or otherwise modifying the workpiece 102 and/or the support member 120. In operation, the air knife 330 initially separates the edge of the protective film 110 from the workpiece 102, and then a removal system or securing device peels the remainder of the protective film from the workpiece as explained above.

Figure 6:
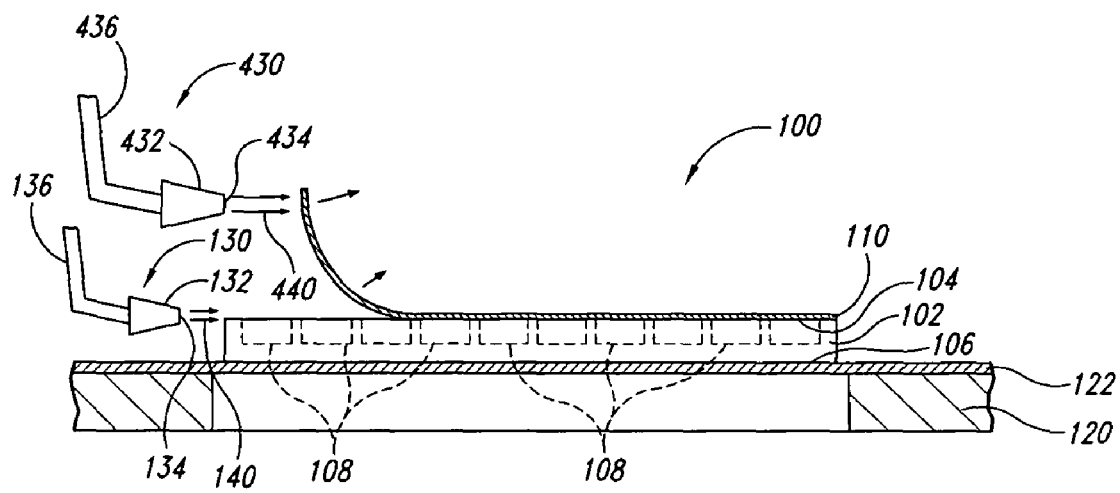
FIG. 6 is a schematic cross-sectional view of a stage in a method for removing a protective film from a microfeature workpiece in accordance with yet another embodiment of the invention.

FIG. 6 illustrates a tape removal system for removing the protective film 110 from the workpiece 102 in accordance with yet another embodiment of the invention. In this embodiment, the removal system 150 (FIG. 3B) does not engage the portion of the protective film 110 detached from the workpiece 102. Instead, one or more second air knives 430 (only one is shown) are activated and direct a high-velocity stream of gas 440 on the detached portion of the protective film 110 to continue the removal process. The second air knife 430 can be generally similar to the first air knife 130 discussed previously. For example, the second air knife 430 can include a head or tip 432 having at least one nozzle 434. In several embodiments, for example, the tip 432 includes a plurality of nozzles 434 arranged such that the profile of the resulting gas stream 440 is relatively wide and flat and contacts a significant portion of the detached protective film 110 to help continue removal of the film from the workpiece 102. In other embodiments, however, the nozzles 434 can have a different arrangement. The second air knife 430 also includes a supply line 436 operably coupled between the head 432 and a gas supply (not shown). The gas expelled by the air knife 430 can be generally similar to the gas expelled by the air knife 130. The first air knife 130 can be deactivated once the second air knife 430 is activated, or both the first and second air knives 130 and 430 can work together to remove the protective film 110 from the workpiece 102.

Figure 7:
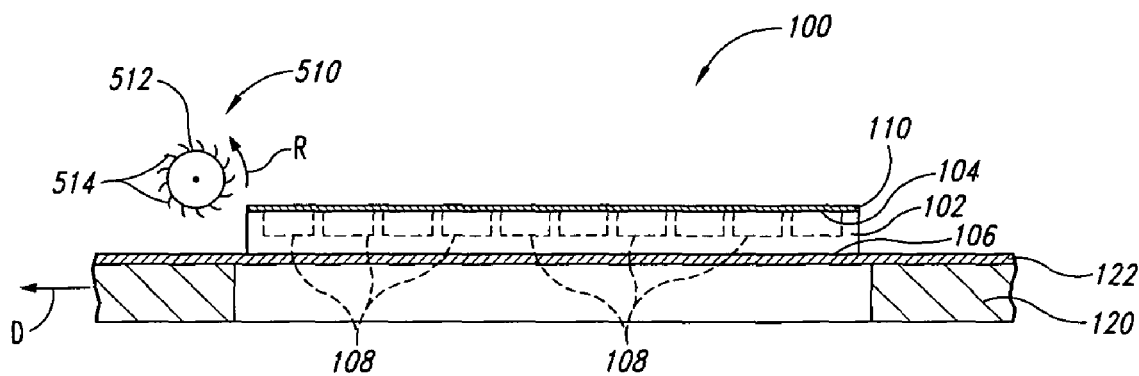
FIG. 7 is a schematic cross-sectional view of a stage in a method for removing a protective film from a microfeature workpiece in accordance with still yet another embodiment of the invention.

FIG. 7 illustrates a tape removal device for removing at least a portion the protective film 110 from the workpiece 102 in accordance with still yet another embodiment of the invention. In this embodiment, the tape removal device or separator includes a removal roller assembly 510 in addition to, or in lieu of, an air knife (not shown) to initiate removal of the protective film 110 from the workpiece 102. The removal roller assembly 510 can include a removal roller 512 having a plurality of flexible bristles 514. In operation, the removal roller assembly 510 is configured to rotate counterclockwise (as shown by the arrow R) and the assembly 100 moves toward the removal roller assembly 510 (as shown by the arrow D) until the bristles 514 engage the protective film 110 and lift or otherwise pull up the film from the edge of the workpiece 102. After initiating removal of the protective film 110 from the workpiece 102, the removal system 150 (FIG. 3B) can engage the free or detached end of the film and continue removing the film from the workpiece as described above with reference to FIGS. 3B and 3C. In other embodiments, the removal roller assembly 510 can have a different arrangement and/or include different features. In still other embodiments, the assembly 100 can be stationary and the removal roller assembly 510 can be configured to move toward the assembly 100 to initiate removal of the protective film 110.

From the foregoing, it will be appreciated that specific embodiments of the invention have been described herein for purposes of illustration, but that various modifications may be made without deviating from the invention. For example, one or more additional air knives can be used in addition to the air knife 130 to initiate removal of the protective film 110 from the workpiece 102. Also, aspects of the invention described in the context of particular embodiments may be combined or eliminated in other embodiments. Further, although advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A method for processing a microfeature workpiece having a first side and a second side opposite the first side, the first side being covered by a protective film and the second side being releasably attached to a support member, the method comprising:
    detaching at least a portion of the protective film from the workpiece by impinging a stream of gas on an interface between the protective film and the first side of the workpiece, wherein the stream of gas is approximately parallel with the first side of the workpiece, and wherein the protective film is removed from at least an edge portion of the workpiece without a removal device contacting or otherwise physically engaging the workpiece.

2. The method of claim 1, further comprising:
    engaging at least a portion of the protective film detached by the stream of gas with a removal system including a peel bar carrying a removal tape configured to adhere to the detached portion of the protective film; and
    completely removing the protective film from the workpiece using the peel bar and/or the removal tape.

3. The method of claim 1, further comprising:
    engaging at least a portion of the protective film detached by the stream of gas with a removal system including a vacuum-type removal system configured to engage and releasably hold the detached portion of the protective film; and
    completely removing the protective film from the workpiece using the removal system.

4. The method of claim 1 wherein the stream of gas is a first stream of gas from a first air knife, and wherein the method further comprises:
    after detaching at least a portion of the protective film from the workpiece with the first stream of gas, completely removing the protective film from the workpiece with a second stream of gas from a second air knife.

5. The method of claim 1 wherein detaching at least a portion of the protective film by impinging a stream of gas on the protective film comprises completely removing the protective film from the workpiece with the stream of gas.

6. The method of claim 1 wherein detaching at least a portion of the protective film from the workpiece with a stream of gas comprises impinging the protective film with an inert, generally particle-free gas.

7. The method of claim 1 wherein detaching at least a portion of the protective film from the workpiece with a stream of gas comprises impinging the protective film with a stream of gas having a pressure of about 80-120 psi.

8. The method of claim 1 wherein detaching at least a portion of the protective film from the workpiece by impinging a stream of gas comprises impinging the protective film with a stream of gas from an air knife.

9. The method of claim 1, further comprising:
releasably engaging a face portion of the protective film proximate to an edge portion of the workpiece with a vacuum-type removal system before impinging a stream of gas on the protective film; and
drawing the protective film away from the workpiece with the removal system before or approximately simultaneously with impinging the protective film with the stream of gas.

10. The method of claim 1 wherein:
detaching at least a portion of the protective film from the workpiece further comprises preventing the stream of gas from affecting the interface between the workpiece and the support member.

11. The method of claim 10 wherein preventing the stream of gas from affecting the interface between the workpiece and the support member comprises shielding or blocking the gas from contacting the support member and/or the interface between the workpiece and the support member.

12. A method for processing a microfeature workpiece, the method comprising:
separating at least a portion of a protective tape from a workpiece to which the protective tape is attached with a separator configured to impinge a stream of gas against an interface between the protective tape and the workpiece and approximately parallel with a first side of the workpiece, wherein the protective tape is removed from at least an edge portion of the workpiece without the separator contacting or otherwise physically engaging the workpiece; and
engaging the portion of the protective tape detached from the workpiece with a removal system.

13. The method of claim 12 wherein separating at least a portion of a protective tape from a workpiece with a separator comprises impinging a stream of gas from an air knife on the interface between the protective tape and the workpiece.

14. The method of claim 12 wherein:
engaging the portion of the protective tape detached from the workpiece with a removal system comprises engaging the detached portion of the protective tape with a peel bar carrying a removal tape configured to adhere to the detached portion of the protective tape; and
wherein the method further comprises completely removing the protective tape from the workpiece using the peel bar and/or the removal tape.

15. The method of claim 12 wherein:
engaging the portion of the protective tape detached from the workpiece with a removal system comprises engaging the detached portion of the protective tape with a vacuum-type removal system configured to engage and releasably hold the detached portion of the protective tape; and
wherein the method further comprises completely removing the protective tape from the workpiece using the removal system.

16. The method of claim 12, further comprising:
releasably engaging a face portion of the protective tape proximate to an edge portion of the workpiece with a vacuum-type removal system before separating at least a portion of a protective tape from the workpiece with the separator; and
drawing the protective tape away from the workpiece with the removal system before or approximately simultaneously with driving the separator against the interface between the protective tape and the workpiece.

17. The method of claim 12 wherein the workpiece includes a second side opposite the first side, the first side being covered at least in part by the protective tape and the second side being releasably attached to a support member, and wherein:
separating at least a portion of a protective tape from a workpiece with a separator comprises further comprises blocking the separator from affecting the interface between the workpiece and the support member.

18. A method for processing a microfeature workpiece, the method comprising:
releasably attaching a protective tape to a first side of a microfeature workpiece; and
detaching at least a portion of the protective tape from the workpiece by impinging an interface between the protective tape and the first side of the workpiece with a stream of gas, wherein the stream of gas is approximately co-planar with the first side of the workpiece, and wherein the protective tape is detached from at least an edge portion of the workpiece without a removal device contacting or otherwise physically engaging the workpiece.

19. The method of claim 18 wherein detaching at least a portion of the protective tape from the workpiece comprises impinging the interface between the protective tape and the workpiece with a stream of gas from an air knife.

20. The method of claim 18, further comprising completely removing the protective tape from the first side of the workpiece.

21. The method of claim 20 wherein completely removing the protective tape from the first side of the workpiece comprises:
engaging the portion of the protective tape detached by the stream of gas with a removal system including a peel bar carrying a removal tape configured to adhere to the detached portion of the protective tape; and
removing the protective tape from the workpiece using the peel bar and/or removal tape.

22. The method of claim 20 wherein completely removing the protective tape from the first side of the workpiece comprises:
engaging at least a portion of the protective film detached by the stream of gas with a removal system including a vacuum-type removal system configured to engage and releasably hold the detached portion of the protective film; and
removing the protective tape from the workpiece using the removal system.

23. The method of claim 20 wherein the stream of gas is a first stream of gas from a first air knife, and wherein completely removing the protective tape from the first side of the workpiece comprises:

after detaching at least a portion of the protective tape from the workpiece with the first stream of gas, completely removing the protective tape from the workpiece with a second stream of gas from a second air knife.

24. The method of claim 18, further comprising:

releasably engaging a face portion of the protective tape proximate to the edge portion with a vacuum-type removal system before detaching at least a portion of the protective tape from the workpiece; and drawing the protective tape away from the first side of the workpiece with the removal system before or at least approximately simultaneously with impinging the interface between the protective tape and the first side of the workpiece with the stream of gas.

25. The method of claim 18, further comprising:

releasably attaching a second side of the workpiece to a support member before detaching at least a portion of the protective tape from the workpiece; and preventing the stream of gas directed to the interface between the protective tape and the first side of the workpiece from impinging on the support member.

26. A method for processing a microfeature workpiece, the method comprising:

releasably attaching a protective film to a first side of a microfeature workpiece;

releasably attaching a second side of the workpiece to a support member;

initiating detachment of the protective film from the workpiece by impinging a stream of gas from an air knife on an interface between the protective film and the first side of the workpiece, wherein the stream of gas from the air knife is approximately parallel with the first side of the workpiece, and wherein the protective film is detached from an edge portion of the workpiece without a removal apparatus contacting or otherwise physically engaging the workpiece;

engaging the detached portion of the protective film with a removal system; and removing the remaining portions of protective film from the workpiece using the air knife and/or the removal system.

27. The method of claim 26 wherein releasably attaching a second side of the workpiece to a support member includes attaching the workpiece to a dicing frame or a vacuum-type support member.

28. The method of claim 26 wherein:

engaging the detached portion of the protective film with a removal system comprises engaging the protective film with a peel bar carrying a removal tape configured to engage at least a portion of the detached protective film; and removing the remaining portions of protective film from the workpiece includes using the peel bar and the removal tape to remove the protective film from the workpiece.

29. The method of claim 26 wherein:

engaging the detached portion of the protective film with a removal system comprises engaging the protective film with a vacuum-type removal system configured to engage and releasably hold at least a portion of the detached protective film; and removing the remaining portions of protective film from the workpiece includes using the removal system to remove the protective film from the workpiece.

30. The method of claim 26, further comprising:

engaging a face portion of the protective film proximate to an edge portion of the workpiece with a vacuum-type removal system after releasably attaching the workpiece to the support member and before initiating detachment of the protective film from the workpiece; and drawing the face portion of the protective film away from the workpiece with the removal system before or approximately simultaneously with impinging the stream of gas on the interface between the protective film and the first side of the workpiece.

31. The method of claim 26, further comprising blocking the stream of gas from the air knife from an interface between the second side of the workpiece and the support member.

32. The method of claim 26 wherein releasably attaching a protective film to a first side of a microfeature workpiece comprises attaching a protective film to a workpiece having a thickness of less than about 100-200 μm.

33. A system for processing a microfeature workpiece having a first side and a second side opposite the first side, the first side being covered by a protective film and the second side being releasably attached to a support member, the system comprising:

a gas delivery device positioned to direct a stream of gas toward an interface between the protective film and the first side of the workpiece to detach at least a portion of the protective film from the workpiece, wherein the gas delivery device is positioned to direct the stream of gas approximately parallel with the first side of the workpiece, and wherein the protective film is removed from at least an edge portion of the workpiece without a removal device contacting or otherwise physically engaging the workpiece.

34. The system of claim 33 wherein the gas delivery device comprises an air knife including a plurality of nozzles arranged in a desired pattern to expel the gas with a desired profile.

35. The system of claim 33, further comprising a removal system positioned to releasably engage a portion of the protective film initially detached by the gas delivery device and remove the remaining attached portion of the protective film from the first side of the workpiece.

36. The system of claim 35 wherein the removal system includes a peel bar and removal tape carried at least in part by the peel bar.

37. The system of claim 35 wherein the removal system includes a vacuum-type removal system.

38. The system of claim 33 wherein the gas delivery device is a first gas delivery device positioned to direct a first stream of gas, and wherein the system further comprises a second gas delivery device positioned to direct a second stream of gas toward a portion of the protective film initially detached by the first stream of gas to continue removal of the protective film from the workpiece.

39. The system of claim 33, further comprising a vacuum-type removal system positioned to releasably engage a face portion of the protective film proximate to a periphery portion of the workpiece, the removal system being configured to draw the protective film away from the first side of the workpiece before or at least approximately simultaneously with the gas delivery device impinging the stream of gas on the interface between the protective film and the workpiece.

40. The system of claim 33 wherein the gas delivery device is a first air knife positioned to direct a first stream of gas, and wherein the system further comprises a second air knife positioned to direct a second stream of gas toward the portion of the protective film initially detached by the first stream of gas to remove the protective film from the workpiece.

41. The system of claim 40 wherein the gas delivery device comprises a shielding portion positioned to block the stream of gas from impinging on the support member and/or an interface between the second side of the workpiece and the support member.

42. A system for processing a microfeature workpiece, the system comprising:

a separator configured to drive against an adhesive surface of a protective tape at an interface between the protective tape and a workpiece to which the protective tape is attached, wherein the separator comprises a gas delivery device having a nozzle positioned to direct a stream of gas approximately parallel with a major surface of the protective tape; and a removal system configured to control the movement of a portion of the protective tape detached from the workpiece.

43. The system of claim 42 wherein the separator comprises an air knife positioned to direct the stream of gas toward the interface between the protective tape and the workpiece.

44. The system of claim 42 wherein the removal system includes a peel bar and a removal tape assembly, and wherein the removal tape is carried at least in part by the peel bar.

45. The system of claim 42 wherein the removal system includes a vacuum-type removal system.

46. A system for processing a microfeature workpiece, the system comprising:

separator means for driving against an adhesive surface of a protective tape at an interface between the protective tape and a workpiece to which the protective tape is attached, wherein the separator means comprises one or more gas delivery nozzles positioned to direct a stream of gas approximately parallel with the adhesive surface of the protective tape, and wherein the separator means is configured to remove the protective tape from at least an edge portion of the workpiece without a removal apparatus contacting or otherwise physically engaging the workpiece; and removal means for controlling movement of a portion of the protective tape detached from the workpiece.

47. The system of claim 46 wherein the separator means comprises an air knife positioned to direct the stream of gas toward the interface between the protective tape and the workpiece.

48. A method for processing a microfeature workpiece having a first side and a second side opposite the first side, the first side being covered by a protective film and the second side being releasably attached to a support member, the method comprising:

detaching at least a portion of the protective film from the workpiece by impinging a stream of gas on an interface between the protective film and the first side of the workpiece; and preventing the stream of gas from affecting the interface between the workpiece and the support member.

49. A system for processing a microfeature workpiece having a first side and a second side opposite the first side, the first side being covered by a protective film and the second side being releasably attached to a support member, the system comprising:

a gas delivery device positioned to direct a stream of gas toward an interface between the protective film and the first side of the workpiece to detach at least a portion of the protective film from the workpiece; and a shielding portion positioned to block the stream of gas from impinging on the support member and/or an interface between the second side of the workpiece and the support member.

* * * * *